(12) United States Patent
Vreeland et al.

(10) Patent No.: US 11,784,123 B2
(45) Date of Patent: *Oct. 10, 2023

(54) METHODS AND STRUCTURES FOR IMPROVED ELECTRICAL CONTACT BETWEEN BONDED INTEGRATED CIRCUIT INTERFACES

(71) Applicant: Intel Corporation, Santa Clara, CA (US)

(72) Inventors: Richard Vreeland, Beaverton, OR (US); Colin Carver, Hillsboro, OR (US); William Brezinski, Beaverton, OR (US); Michael Christenson, Hillsboro, OR (US); Nafees Kabir, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/677,858

(22) Filed: Feb. 22, 2022

(65) Prior Publication Data

US 2022/0181251 A1 Jun. 9, 2022

Related U.S. Application Data

(63) Continuation of application No. 16/584,666, filed on Sep. 26, 2019.

(51) Int. Cl.
*H01L 23/528* (2006.01)
*H01L 23/532* (2006.01)
(Continued)

(52) U.S. Cl.
CPC ........ *H01L 23/528* (2013.01); *H01L 21/7684* (2013.01); *H01L 21/76819* (2013.01);
(Continued)

(58) Field of Classification Search
CPC ............ H01L 23/5386; H01L 21/4846; H01L 21/566; H01L 21/76871; H01L 21/76879;
(Continued)

(56) References Cited

U.S. PATENT DOCUMENTS 11,289,421 B2* 3/2022 Vreeland ............. H01L 21/7684
2019/0385963 A1 12/2019 Chen et al.

OTHER PUBLICATIONS

Non-Final Office Action from U.S. Appl. No. 16/584,666 dated Dec. 8, 2020, 9 pgs.

(Continued)

*Primary Examiner* — Jasmine J Clark
(74) *Attorney, Agent, or Firm* — Essential Patents Group, LLP

(57) ABSTRACT

Composite integrated circuit (IC) device structures that include two components coupled through hybrid bonded interconnect structure. The two components may be two different monolithic IC structures (e.g., chips) that are bonded over a substantially planar dielectric and metallization layer. A surface of a metallization feature may be augmented with supplemental metal, for example to at least partially backfill a recess in a surface of the metallization feature as left by a planarization process. In some exemplary embodiments, supplemental metal is deposited selectively onto a metallization feature through an autocatalytic (electroless) metal deposition process. A surface of a dielectric material surrounding a metallization feature may also be recessed, for example to at least partially neutralize a recess in an adjacent metallization feature, for example resulting from a planarization process.

20 Claims, 13 Drawing Sheets

(51) Int. Cl.
    *H01L 23/00*         (2006.01)
    *H01L 21/768*      (2006.01)
    *H01L 21/321*       (2006.01)
    *H01L 21/3105*     (2006.01)

(52) U.S. Cl.
    CPC .. *H01L 23/53238* (2013.01); *H01L 23/53257* (2013.01); *H01L 24/08* (2013.01); *H01L 24/89* (2013.01); *H01L 21/31053* (2013.01); *H01L 21/3212* (2013.01); *H01L 2224/08145* (2013.01); *H01L 2224/80031* (2013.01); *H01L 2224/80047* (2013.01); *H01L 2224/80895* (2013.01); *H01L 2224/80896* (2013.01)

(58) Field of Classification Search
    CPC ........... H01L 23/3157; H01L 23/49816; H01L 23/49838; H01L 23/49866; H01L 24/32; H01L 24/48; H01L 25/50
    See application file for complete search history.

(56) References Cited

OTHER PUBLICATIONS

Non-Final Office Action from U.S. Appl. No. 16/584,666 dated Jun. 3, 2021, 5 pgs.
Notice of Allowance from U.S. Appl. No. 16/584,666 dated Dec. 9, 2021, 8 pgs.

\* cited by examiner

METHODS AND STRUCTURES FOR IMPROVED ELECTRICAL CONTACT BETWEEN BONDED INTEGRATED CIRCUIT INTERFACES

CLAIM OF PRIORITY

This application is a continuation of, and claims the benefit of priority to, U.S. patent application Ser. No. 16/584,666, filed on Sep. 26, 2019, now U.S. Pat. No. 11,289,421 issued Mar. 29, 2022 and titled "METHODS & STRUCTURES FOR IMPROVED ELECTRICAL CONTACT BETWEEN BONDED INTEGRATED CIRCUIT INTERFACES," which is incorporated by reference in entirety.

BACKGROUND

Demand for integrated circuits (ICs) in portable electronic applications has motivated greater levels of semiconductor device integration. Hybrid bonding is an approach where a first wafer or chip surface having both metallized regions (e.g., copper) and dielectric regions is bonded with second wafer or chip surface having both metallized and dielectric regions that are matched to those of the first wafer or chip surface so that both metal-to-metal bonds and dielectric-to-dielectric bonds are formed. Such bonding may allow for the dimensions of die packaging electrical connections to be shrunk well below prior limits, thereby increasing the interconnect densities and/or increasing the number of addressable signals for a composite IC chip of a given size (footprint).

Successful hybrid bonding depends, in part, on achieving two mating surfaces that can be placed into intimate contact with each other so that chemical bonds between the mating surfaces are formed. Typically, each mating surface is made as flat as possible, for example with planarization processes that are capable of achieving high degrees of surface planarity over long distances (e.g., millimeters). Chemical-mechanical planarization (CMP) processes generally achieve optimal flatness metrics on compositionally homogeneous surfaces. Hence, a CMP process that achieves optimal flatness for a wholly metal surface or wholly dielectric surface will not typically achieve the same flatness for a hybrid surface having both metallization and dielectric regions. Instead, non-uniformity in the polishing process (e.g., resulting from differences in material densities, polish rates, or hardness) can leave hybrid surfaces with non-planarity. Such non-planarity is generally referred to as "dishing," for example, where a metallized feature surface is slightly recessed (e.g., tens of nanometers) below that of a surrounding dielectric material. While some level of dishing may have minimal impact in the context of BEOL metallization processes, bonding performance may be dramatically reduced. For example, two dished metal features may not adequately mate at a bond interface to achieve robust electrical contact.

To reduce dishing in the context of back-end-of-line (BEOL) damascene interconnect metallization processes, long-range planarity in CMP processes have in the past been improved markedly through the practice of dummification where dummy metallization features are added as needed to ensure a given surface to be planarized has a threshold level of feature pattern density. While dummy structures typically have no function in an ICs final circuitry, their presence can enable planarization of an IC metallization level having any density of functional features to within a target flatness specification. However, dummification is not well suited to the task of hybrid bonding for a variety of reason. First, metallization features to be bonded may often be quite large (e.g., many microns, or even tens of microns in length), and dummification does not readily address non-planarity occurring over the micron scale. Second, dummification decreases the dielectric surface area proportion of a bonding surface, which can significantly reduce the overall bond strength.

Long-range planarity may also be improved through optimization of CMP chemistries, pads, and control algorithms, etc. However, CMP is a relative mature technology, which has been developed over decades in the context of BEOL damascene interconnect metallization processes. While further optimization in the long-range planarity for bonding interfaces will occur, improvements will likely be limited by mask design rules and differences between metal and dielectric material properties.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
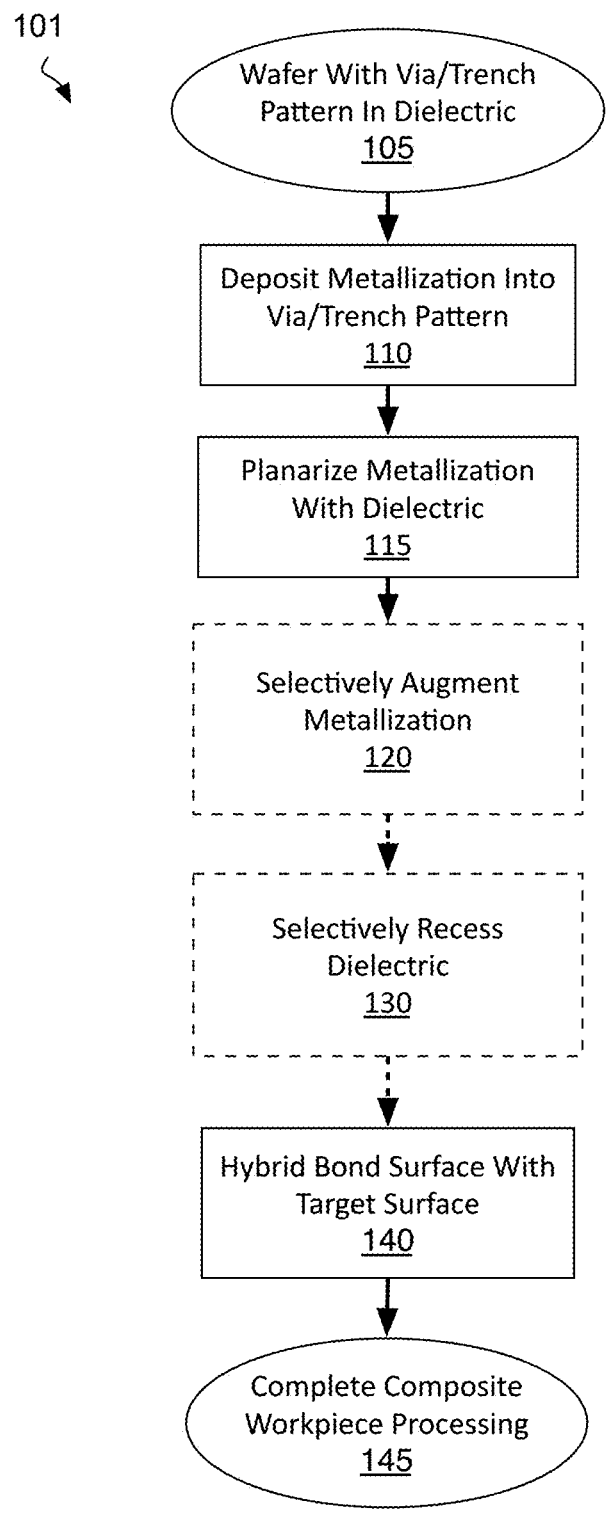
FIG. 1 is a flow diagram illustrating methods of hybrid bonding surfaces and forming bonded composites, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are composite integrated circuit (IC) device structures that include two components coupled through hybrid bonded interface. In exemplary embodiments, the two components are two different monolithic IC structures (e.g., chips) that are bonded over a substantially planar dielectric and metallization layer In accordance with some embodiments, a surface of a metallization feature is augmented with supplemental metal, for example to at least partially backfill a recess or "dish" in a surface of the metallization feature resulting from a planarization process (e.g., CMP). As such, a composite interconnect structure including bonded metallization features may include supplemental metal at their bond interface. In some exemplary metal augmentation embodiments, supplemental metal is deposited selectively onto a metallization feature through an autocatalytic (electroless) metal deposition process. The supplemental metal may have the same majority constituent(s) as the metallization feature that may have been deposited, for example by an electrolytic deposition process. The supplemental metal may have one or more attributes that distinguish it from the underlying metallization. For example, the supplemental metal may lack one or more dopants present in the underlying metallization (i.e., the supplemental metal may be more pure than the underlying metal). Alternatively, the supplemental metal may have one or more additional dopants that are absent from the underlying metallization. The supplemental metal may also have different crystallinity than the underlying metallization feature. For example, the supplemental metal may have a different polycrystalline texture than the underlying metal. In other examples, the supplemental metal may have a different density than the underlying metallization feature.

In accordance with some embodiments, a surface of a dielectric material surrounding a metallization feature is recessed, for example to neutralize a recess or "dish" in a surface of an adjacent metallization feature resulting from a planarization process (e.g., CMP). In some exemplary embodiments, the dielectric surface is etched with a blanket (i.e., unmasked) dry etch process that recesses the dielectric material selectively relative to the metallization feature. In some embodiments where the metallization feature is separated from the dielectric material by one or more barrier materials, the dielectric material recess etch is also selective to at least one of the barrier materials.

Metallization augmentation and/or dielectric recess processes may be independently targeted and/or combined to achieve feature topographies favorable for hybrid bonding of any arrangement of metal/dielectric feature geometries, and for a variety of material systems. For example, metallization surfaces having less than 100 nm of recess (e.g., 20-40 nm of recess) may be augmented with supplemental metal having a comparable thickness (e.g., 20-40 nm). Alternatively, a surrounding dielectric material surface may be recessed by a comparable thickness (e.g., 20-40 nm). Alternatively, metallization surfaces may be augmented (e.g., with 10-20 nm of supplemental metal), and the surrounding dielectric material surface may be recessed (e.g., by 10-20 nm). In still other embodiments, an amount of augmentation or dielectric recess may significantly exceed an amount of metallization recess, for example by a factor of approximately two, such that a mating surface that displays similar degree of non-planarity may be sufficiently accommodated to ensure a good electrical contact is achieved at the metal-metal bond interface of two metallization features.

FIG. 1 is a flow diagram illustrating composite IC fabrication methods 101, in accordance with some embodiments. Methods 101 begin with preparing a workpiece having a hybrid surface suitable for bonding. Such a hybrid surface may be prepared according to any damascene process suitable for BEOL interconnect metallization, for example. At block 105, a starting material, such as a semiconductor wafer, is received. The starting material may advantageously include a monocrystalline semiconductor layer, such as a silicon layer, upon which field effect transistors (FETs) may have been fabricated, for example upstream of methods 101. The starting material received may include FETs of any architecture. The FETs may be interconnected into circuitry by one or more interconnect metallization levels. In some examples, the FETs include both n-type and p-type FETs interconnected into a CMOS circuit. In other embodiments, the substrate received at block 105 includes no prefabricated transistors or any other active microelectronic devices. For example, the substrate may be a passive interposer that includes only interconnect metallization layers.

Figure 2A:
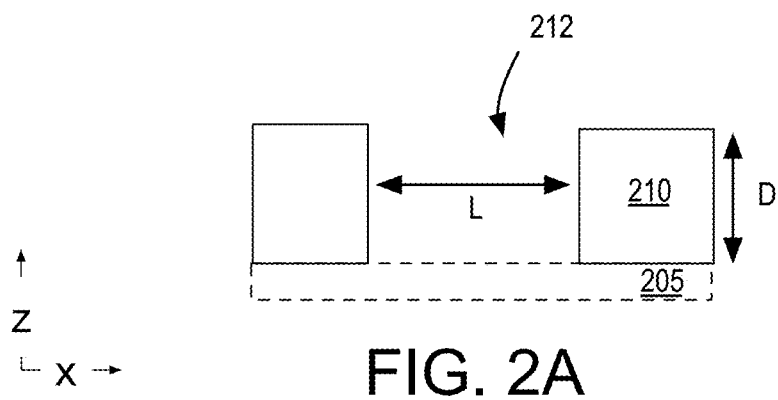
FIGS. 2A, 2B and 2C are cross-sectional views of fabrication and planarization of a metallization feature within a dielectric material, in accordance with some embodiments.

A working surface of the starting material received at block 105 includes a via and/or trench pattern in a dielectric material. The via and/or trench pattern may have been lithographically defined and anisotropically etched into the dielectric material, for example. FIG. 2A is cross-sectional view of workpiece that includes an opening 212 within a dielectric material 210, in accordance with some embodiments. Dielectric material 210 may be any low-k material (e.g., having a relative permittivity below about 3.5), or moderate-k material (e.g., having a relative permittivity above about 3.5). Exemplary dielectric materials include silicon dioxide, silicon nitride, silicon oxynitride, or carbon doped oxide (SiOC). Dielectric material 210 is over an area of a substrate 205, which is illustrated in dashed line to emphasize that substrate 205 may include any number of BEOL metallization layers and/or FEOL semiconductor material layers. As shown in FIG. 2A, an opening 212 extends into dielectric material 210. Opening 212 may have any lateral dimensions (e.g., within x-y plane) and may have any depth (e.g., along z-axis). In one example, opening 212 is a trench having a minimum transverse width equal to lateral length L, and a longer longitudinal length in a direction orthogonal to the transverse width (e.g., y-axis). In another example, opening 225 is a via having a diameter approximately equal to lateral length L, extending into substrate 205, and landing on an underlying metallization layer (not depicted). The lateral length L may vary widely, for example from tens of nm to tens of microns. In some exemplary embodiments, lateral length L is at least 1 μm, and may be 10 μm, or more. Although illustrated to extend through dielectric 210, opening 212 may have a widely varying depth D (e.g., z-axis) that may be less than or greater than the film thickness of dielectric 210. Opening depth D may vary from tens to hundreds of nanometers, for example. In some exemplary embodiments where the lateral length L is at least 1 μm, depth D is less than 1 μm. Notably, the aspect ratio illustrated for opening 212 is not to scale with the z-axis being magnified and the x-axis being compressed.

Returning to FIG. 1, methods 101 continue at block 110 where metallization is deposited to fill the via and/or trench pattern. Any metal deposition process may be employed at block 110 to deposit one or more metallic compounds and/or metals. In some embodiments, block 110 entails the deposition of one or more barrier materials, which may be any metal or metallic compound known to be suitable for containing BEOL metallization. Such barrier material(s) may be deposited by any suitable deposition technique, such as, but not limited to, physical vapor deposition (PVD), chemical vapor deposition (CVD), atomic layer deposition (ALD), or electroless deposition (ED).

Figure 2B:
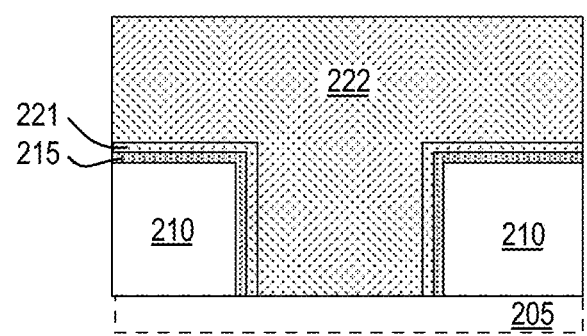

In the example illustrated in FIG. 2B, a barrier material 215 is in contact with a sidewall and top surface of dielectric material 210. A fill metal 222 is over barrier material 215. Barrier material 215 is illustrated as being substantially conformal, but it need not be. In some embodiments, barrier material 215 comprises a metal, such as, but not limited, Ti, W, or Ta with Ta being particularly well suited for retarding outdiffusion of fill metals comprising Cu. In some exemplary embodiments, barrier material 215 further comprises nitrogen with one exemplary metallic compound being $TaN_x$. In some further embodiments, barrier material 215 further comprises one or more other minor constituent, such as, but not limited to Si (e.g., Ta—Si—N), or other similar dopant. Barrier material 215 may also comprise multiple material layers, for example with a first material layer improving adhesion of the next layer (e.g., Ta/TaN). Barrier material 215 may have any thickness known to be suitable for BEOL metallization, with some TaN examples being in the 2-20 nm range.

Block 110 may further entail the deposition of one or more fill metals. The fill metal comprises one or more metals that are advantageously contained by the barrier material. Fill metal 222 may comprise one or more metal, such as, but not limited to predominantly Cu, predominantly Co, or predominantly Ru. The fill metal may be deposited by any technique(s) known to be suitable for the particular metal(s). In some exemplary embodiments, fill metal deposition at block 110 comprises first the deposition of a seed layer by some non-electrolytic means (e.g., PVD, autocatalytic deposition, etc.) followed by an electrolytic plating process.

FIG. 2B illustrates an exemplary Cu embodiment, where fill metal 222 is electrolyticly plated upon a seed layer 221. Seed layer 221 may comprises predominantly the major constituent of fill metal 222, and may have substantially the same composition as fill metal 222. Seed layer 221 may include one or more dopants that are absent from fill metal 222. Seed layer 221 is also illustrated as substantially conformal, but need not be. In some examples, seed layer 221 comprises predominantly Cu and may further include one or more dopants, such as Al (e.g., 0.5-1.5%). Seed layer 221 may have any thickness known to be suitable for BEOL metallization, with some exemplary Cu/Cu alloy examples being in the 2-20 nm range.

Returning to FIG. 1, methods 101 continue at block 115 where the metallization is planarized with a surface of the dielectric to define a planar hybrid surface comprising metallization features embedded within dielectric material. At block 115 any CMP process known to be suitable for BEOL metallization may be practiced, for example, to remove metallization overburden and remove any barrier and/or adhesion layer materials to expose the underlying dielectric material. This last operation in the damascene metallization process ideally leaves the hybrid metal/dielectric surface sufficiently flat. However, as noted above, a CMP process practiced at block 115 may slightly recess a metallization surface from a surrounding dielectric surface. While small recesses may not pose any issue for a subsequent BEOL metallization layer (e.g., also fabricated according to a damascene technique), they may pose a significant issue for a hybrid surface that is to be bonded.

Figure 2C:
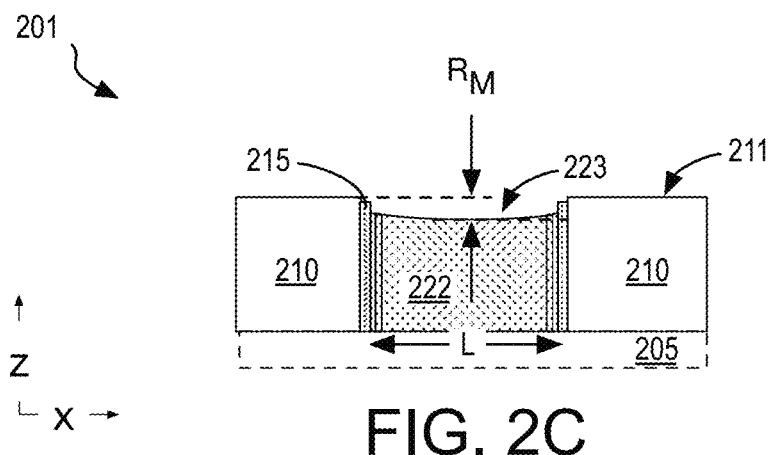

In the example shown in FIG. 2C, a hybrid bonding feature 201 following an exemplary CMP process includes a metallization surface 223 that is slightly recessed, or "dished" from the surrounding dielectric surface 211. Fill metal 222 has a metallization recess $R_M$ from a dielectric surface 211 that may vary from a few nanometers to a few hundred nanometers as a function of CMP process parameters, the metallization feature size, pattern density, and the material properties (e.g., hardness, density, etc.) of fill metal 222 and dielectric material 210. If hybrid bonding feature 201 was to be mated with another bonding feature having similar bonding surface dishing, for example, electrical contact across the bond may be relatively poor.

Figure 3:
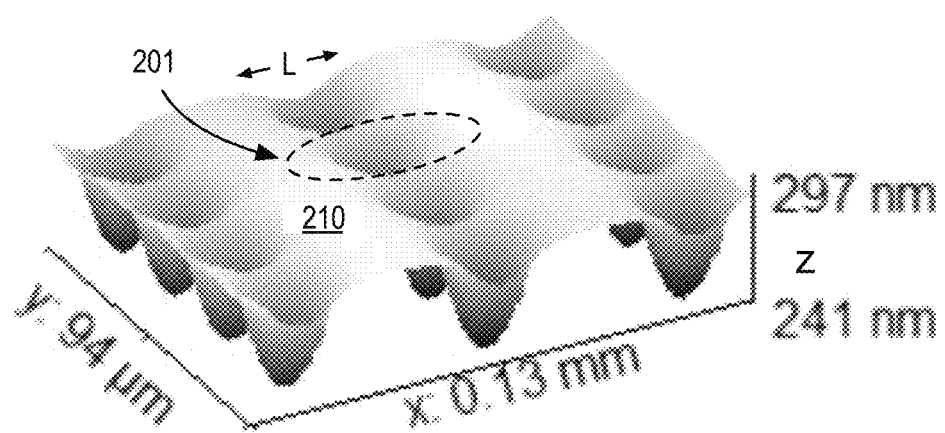
FIG. 3 is isometric views of a white light interferometry data for a hybrid bonding surface following a metal planarization process, in accordance with some embodiments.

FIG. 3 is an isometric view of experimental white light interferometry data collected for a hybrid surface following a metal planarization process, in accordance with some embodiments. The aspect ratio in FIG. 3 is not scale with the x-y plane compressed to show a twelve metallization features (e.g., "pads") spatially arrayed within dielectric material 210, and the z-axis magnified to illustrate the dishing of fill metal 222. In this example, hybrid bonding feature 201 is highlight by dashed line. Each metallization feature has a lateral length L is well over 10 μm with a Cu metallization pattern density that is in the range of 15-20%. In FIG. 3, the z-axis is representative of the metallization recess depth $R_M$, which in this example is around 50 nm (+/−5 nm). Metallization features in a region of lower feature pattern density will tend to dish a little more than the same size pad in a region of higher density, but this difference can be expected to be less than 20-30%.

Returning to FIG. 1, following metallization and planarization, methods 101 continue with one or more of selective metallization augmentation at block 120 or selective dielectric recession at block 130. Blocks 120 and 130 are illustrated in dashed line to emphasize that, depending on the embodiment, only one of blocks 120 and 130 may be performed, or both may be performed. For embodiments where both blocks 120 and 130 are performed, the blocks 120 and 130 may be performed in any order as the processing at each of blocks 120 and 130 is substantially independent of the other.

In some embodiments, metallization is selectively augmented with an autocatalytic metal deposition process. Autocatalytic deposition processes for a variety of metals including, but not limited to, Cu, Ni, Au, and Ag, are commercially available. Autocatalytic deposition will deposit metal upon a catalytic metal surface while no metal is deposited on a non-catalytic dielectric surface. Autocatalytic metal deposition processes are generally wet chemical processes comprising a solvated metal species and a reducing agent. One or more chelating or complexing agents may also be included in an autocatalytic metal deposition solution. Various other additives (e.g., suppressors and anti-suppressors) may also be employed to tune a given solution to balance deposition rates with feature fill. Typically, autocatalytic deposition solution chemistry is basic, as opposed to an electrolytic deposition solution chemistry that is generally acidic. Also unlike electroplating, no external current is employed to drive the deposition, and is therefore often referred to as electroless plating. Oxidation of a reducing agent may provide the electron source for reducing ionic metal species out the solvent and into their metallic form. Since no conductive seed layer is required, and metal deposition is limited to metal surfaces, the autocatalytic deposition performed at block 120 may selectively augment a metallized feature to any extent desired, for example as controlled by deposition time, temperature, and solution chemistry.

Figure 4:
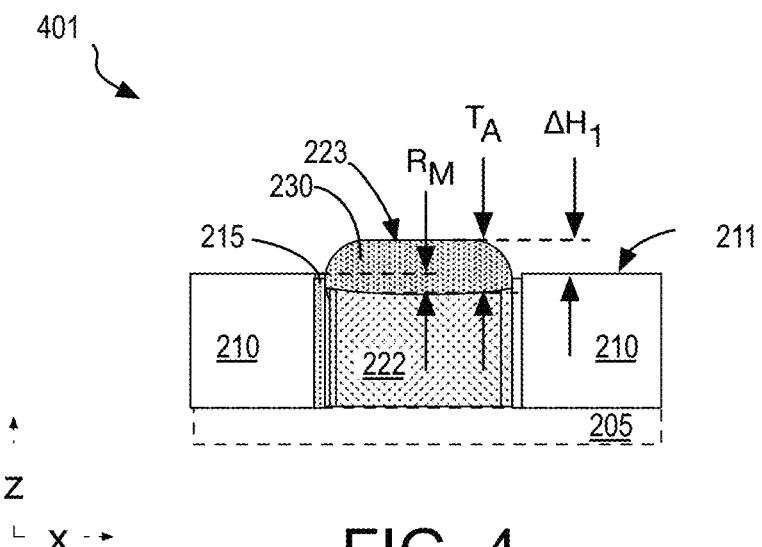
FIG. 4 is a cross sectional view of selective augmentation of the metallization feature introduced in FIG. 2C, in accordance with some embodiments.

In the example shown in FIG. 4, an augmented hybrid bonding feature 401 includes augmentation metal 230 in contact with at least fill metal 222. The augmented hybrid bonding feature 401 is substantially the same hybrid bonding feature 201 introduced above (FIG. 2C) except for the addition of augmentation metal 230. As shown in FIG. 4, augmentation metal 230 has a thickness $T_A$. In this example, thickness $T_A$ is larger than maximum metallization recess depth $R_M$. As such, top metallization surface 223 has a positive z-height difference $\Delta H_1$ from dielectric surface 211. Metallization surface 223 is therefore no longer dished below dielectric surface 211, and instead is proud of dielectric surface 211. In some specific embodiments, augmentation metal 230 has a thickness $T_A$ that is approximately equal to twice the metallization recess depth $R_M$ so that z-height difference $\Delta H_1$ is approximately equal to metallization recess depth $R_M$. However, in other embodiments thickness $T_A$ may be substantially equal to metallization recess depth $R_M$, or less than metallization recess depth $R_M$. Although thickness $T_A$ may therefore vary widely, an exemplary range is 5-100 nm.

As illustrated in FIG. 4, no augmentation metal 230 forms over dielectric surface 211. However, for embodiments where the autocatalytic deposition process is substantially isotropic, augmentation metal 230 may laterally overgrow barrier material 215 and even extend over the sidewall of dielectric material 210, for example by a lateral distance of approximately $\Delta H_1$ as measured from an inner sidewall of barrier material 215.

Augmentation metal 230 may comprise one or more of Cu or Ni, Au, and Ag, for example. In some embodiments, augmentation metal 230 comprises predominantly the same metal as fill metal 222. For example, augmentation metal comprising predominantly copper may supplement a fill metal comprising predominantly copper. In other embodiments, augmentation metal 230 comprises predominantly a metal that is absent from fill metal 222. For example, augmentation metal comprising predominantly cobalt may supplement a fill metal comprising predominantly copper. Augmentation metal 230 may have a different impurity/dopant content, crystallinity, or density than that of fill metal 222. Hence, even where fill metal 222 and augmentation metal 230 are both predominantly the same metal (e.g., Cu), one or more analysis techniques (e.g., X-ray photoelectron spectroscopy (XPS), ray diffraction (e.g., XRD), or transmission electron microscopy (TEM)) may be employed to distinguish augmentation metal 230 from fill metal 222. In some embodiments, augmentation metal 230 is higher purity (e.g., Cu) than fill metal 222. In some embodiments, augmentation metal 230 has a higher density (e.g., Cu) than fill metal 222 (e.g., with augmentation metal 230 appearing darker than fill metal 222 in a TEM image). In other embodiments, augmentation metal 230 has different crystalline texture than fill metal 222, and/or a crystalline boundary is evident between augmentation metal 230 and fill metal 222.

Figure 5:
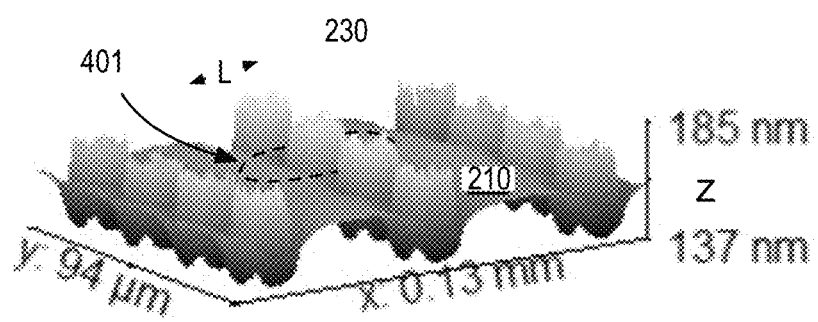
FIG. 5 is an isometric view of white light interferometry data for a hybrid bonding surface following planarization and metallization augmentation, in accordance with some embodiments.

FIG. 5 is an isometric view of experimental white light interferometry data collected following selective metal augmentation of a sample, in accordance with some autocatalytic Cu deposition embodiments. The aspect ratio in FIG. 5 is not scale with the x-y plane compressed to show a twelve metallization features (e.g., "pads") spatially arrayed within dielectric material 210, and the z-axis magnified to illustrate augmentation metal 230 extending to z-heights beyond that of the surface of dielectric material 210. In this example, hybrid bonding feature 401 is highlighted by dashed line. Although not the same sample illustrated in FIG. 3, each metallization feature has a lateral length L that is similarly well over 10 µm, and the Cu metallization pattern density is in the range of 15-20%. The z-axis is representative of an augmentation metal thickness $T_A$ of around 40 nm. As such, the z-height difference $\Delta H_1$ for this sample may be around 20 nm.

In some embodiments, autocatalytic metal deposition has a pattern density dependence that varies in the same manner dishing depends upon pattern feature density. For example, augmentation metallization deposition rates may be greater in less dense feature patterns, which is consistent with greater metal recession occurring in less dense feature patterns. As such, metal augmentation through autocatalytic deposition processes may mitigate metal feature dishing in a manner that improves planarity across regions of different feature density.

Returning to FIG. 1, methods 101 may continue with selective dielectric recession at block 130. As noted above, selective dielectric recession may be performed in combination with selective metal augmentation block 120, or in the alternative to selective metal augmentation. At block 130, the dielectric material that was planarized with metallization features at block 115 is recessed from the exposed surface of the metallization with any etch process that will etch the dielectric material at some non-zero rate without significantly eroding the metallization feature surface(s). At block 130, dielectric material may be etched back with a maskless process. In some embodiments, the dielectric material is isotropically etched although anisotropic processes may also be suitable. Noting that dishing may be only a few tens of nanometers, the dielectric etch process is advantageously controllable to within a few nanometers. Depending on the metallization and dielectric material composition, wet chemical etch process (e.g., dilute HF) may be possible although some metallizations and/or dielectric materials may not tolerate acidic solutions. Hence, in some exemplary embodiments, dielectric material is etched back with a plasma (dry) etch process employing a fluorine-based chemistry (e.g., $CF_4$). Such a process may be suitable for both low-k and moderate-k dielectric materials.

In the example shown in FIG. 6, a recessed hybrid bonding feature 601 includes dielectric material surface 211 that has been recessed to be below a planarized surface of barrier material 215 by a dielectric recess depth $R_D$. As shown, recessed hybrid bonding feature 601 is substantially the same hybrid bonding feature 201 introduced above (FIG. 2C) except for the recession of dielectric material 210. Barrier material 215 (e.g., a metal compound) may be substantially unetched by the dielectric etchant employed to recess etch dielectric material surface 211, so that dielectric recess depth $R_D$ is indicative of a dielectric recess etch and demarks the extent of dielectric recession. The dielectric recess depth $R_D$ may be targeted, for example through control of the recess etch process duration, to achieve any suitable z-height difference $\Delta H_2$ between the surface of fill metal 222 and dielectric material surface 211. Even where barrier material 215 is recessed etched to some degree relative to dielectric material 210, or even where barrier material 215 is absent, an appreciable z-height difference $\Delta H_2$ is indicative of a dielectric recess etch and can be employed to quantify the extent of dielectric recession around a metallization feature.

Figure 6:
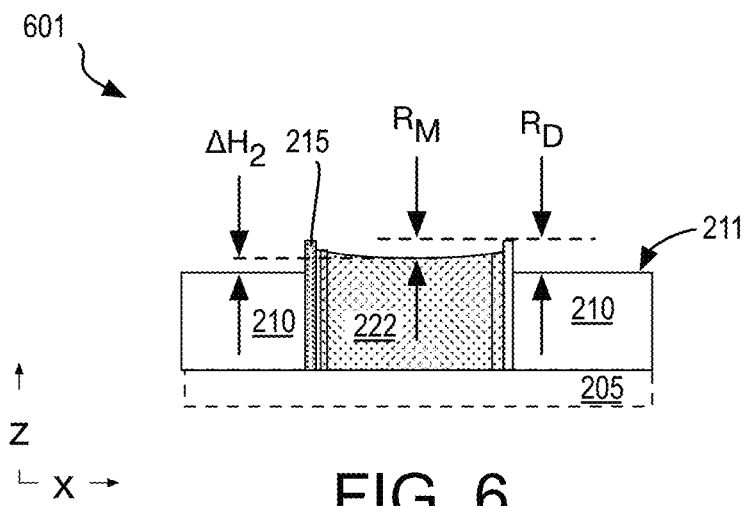
FIG. 6 is a cross-sectional view of a selective recess of dielectric material around the metallization feature introduced in FIG. 2C, in accordance with some embodiments.

In the example shown in FIG. 6, dielectric recess depth $R_D$ is larger than metallization recess depth $R_M$. As such, top metallization surface 223 has a positive z-height difference $\Delta H_2$ from dielectric surface 211. Metallization surface 223 is therefore no longer dished below dielectric surface 211, and instead is proud of dielectric surface 211. In some specific embodiments, dielectric recess depth $R_D$ is approximately equal to twice the metallization recess depth $R_M$ so that z-height difference $\Delta H_2$ is approximately equal to metallization recess depth $R_M$. However, in other embodiments dielectric recess depth $R_D$ may be substantially equal to metallization recess depth $R_M$, or less than metallization recess depth $R_M$. Although recess depth $R_D$ may therefore vary widely, an exemplary range is 5-100 nm.

Figure 7:
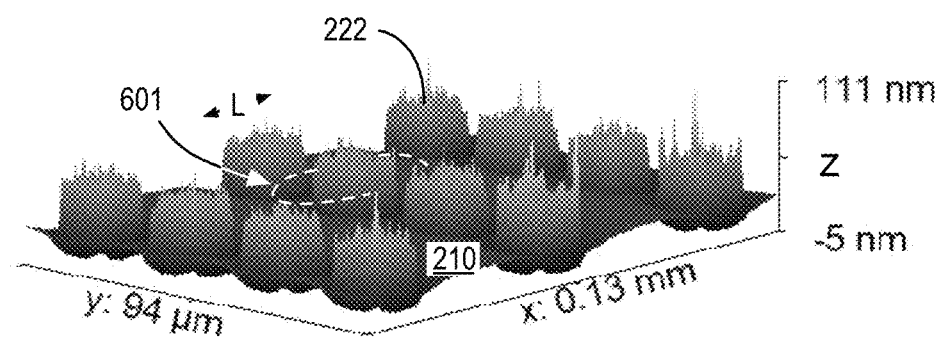
FIG. 7 and is an isometric view of white light interferometry data for a hybrid bonding surface following planarization and dielectric recess, in accordance with some embodiments.

FIG. 7 is an isometric view of experimental white light interferometry data of a hybrid bonding surface collected following selective dielectric recess of a planarized hybrid bonding sample, in accordance with some embodiments. The aspect ratio in FIG. 7 is not scale with the x-y plane compressed to show a twelve metallization features (e.g., "pads") spatially arrayed within dielectric material 210, and the z-axis magnified to illustrate recession of dielectric material 210 relative to fill metal 222. In this example, hybrid bonding feature 601 is highlighted by dashed line. Although not the same sample illustrated in FIG. 3, each metallization feature similarly has a lateral length L well over 10 µm, and the Cu metallization pattern density is in the range of 15-20%. The z-axis is representative of a z-height difference $\Delta H_2$ of around 100 nm.

Figure 8:
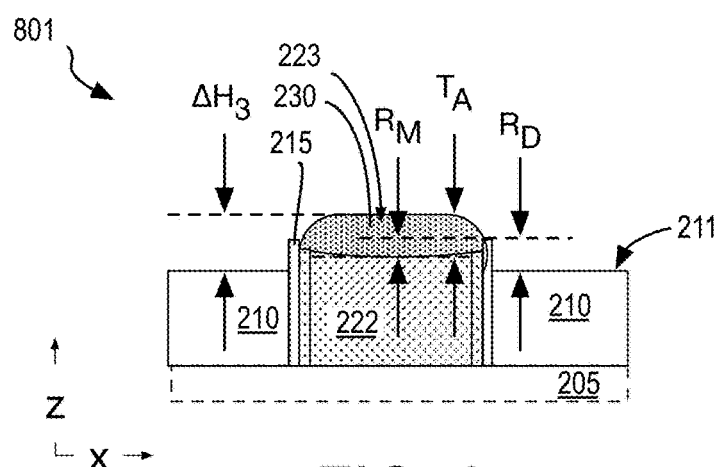
FIG. 8 is a cross-sectional view of a selective augmentation of a metallization feature and a selective recess of dielectric material around the metallization feature, in accordance with some embodiments.

As noted above, selective metal augmentation and selective dielectric recession may be combined together to prepare a hybrid bonding feature for subsequent bonding. FIG. 8 illustrates an exemplary hybrid bonding feature 801 that includes augmentation metal 230 and also has a dielectric material surface 211 that is recessed from barrier material 215 by dielectric recess depth $R_D$. In the example shown in FIG. 8, both augmentation metal thickness $T_A$ and dielectric recess depth $R_D$ exceed metallization recess depth $R_M$. As such, top metallization surface 223 has an accumulated z-height difference $\Delta H_3$ from dielectric surface 211. In some specific embodiments, augmentation metal thickness $T_A$ and dielectric recess depth $R_D$ are each approximately equal to about half the metallization recess depth $R_M$ so that z-height difference $\Delta H_3$ is approximately equal to the metallization recess depth $R_M$. However, in other embodiments augmentation metal thickness $T_A$ and/or dielectric recess depth $R_D$ may each be equal to, or greater than, metallization recess depth $R_M$.

Returning to FIG. 1, methods 101 continue at block 140 after one or more of blocks 120 and 130 have been completed. At block 140, the hybrid bonding structure prepared according to blocks 110-130 is bonded to some target surface, such as a surface of a single die (chip), or a surface of a wafer. In some embodiments, the target surface also includes a hybrid bonding structure that has also been prepared according methods 101. In other embodiments, the target surface includes a hybrid bonding structure that is only processed through damascene operations (e.g., blocks 110 and 115) such that the target surface can be expected to have some metal feature dishing.

In hybrid bonding, chemical bonds are formed both between metallization features (e.g., via metal interdiffusion) and between dielectric materials (e.g., via Si—O—Si condensation bonds) of the host and target. Thermo-compression bonding may be at low temperature (e.g., below melting temperature of the interconnects, and more specifically below 100° C.). Direct bonding at room temperature (i.e., compression only) is also possible. Post bonding, selective heating may be performed, to make permanent the bond. For selective heating, a heat mask may or laser heating may be employed to limit the heat to the specific chiplet locations. Bonding at block 140 may be performed with any permanent bonding system capable of high resolution alignment, such as one commercially available through EV Group, SUSS MicroTec, or Tokyo Electron Limited (TEL), for example.

Figure 9:
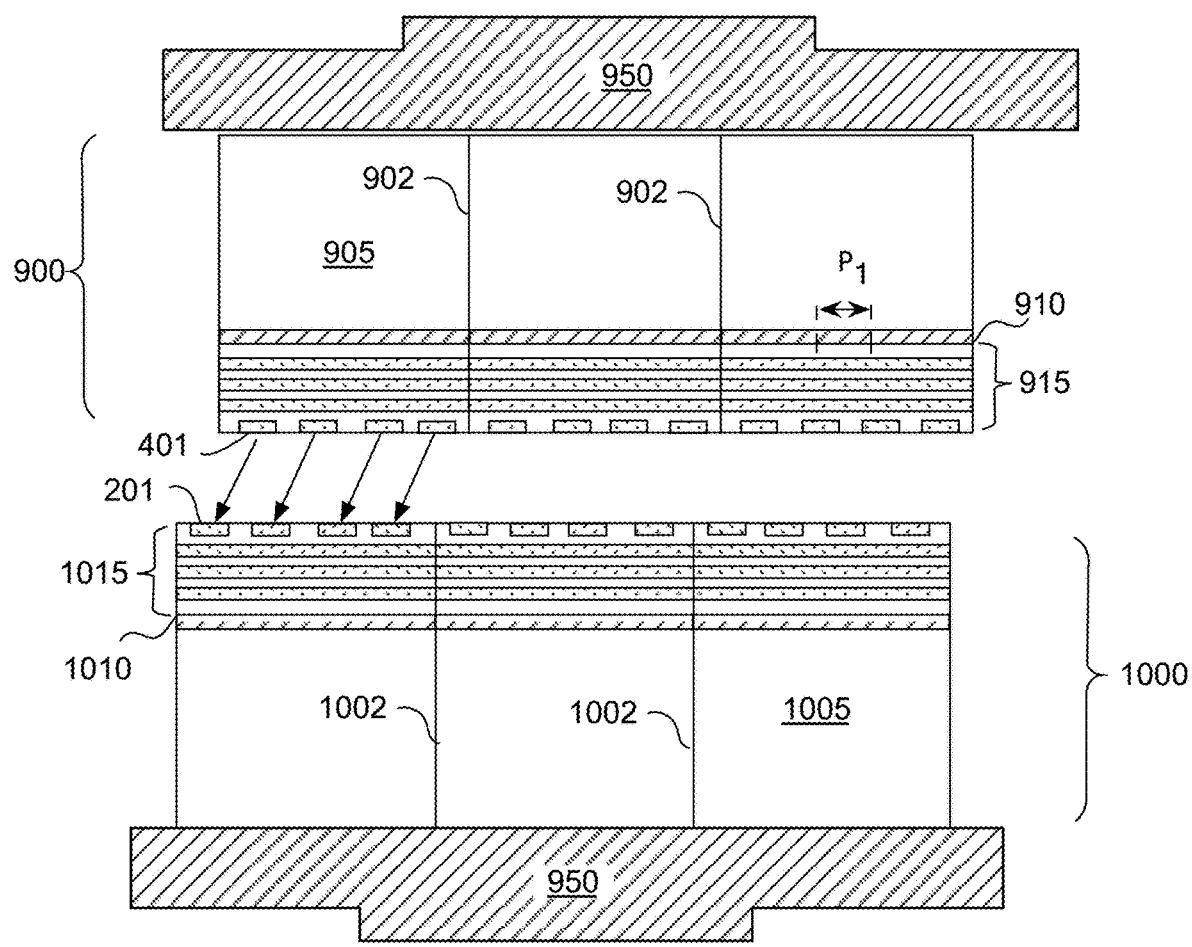
FIG. 9 is a cross-sectional view of wafer-to-wafer hybrid bonding, in accordance with some embodiments.

In the example further illustrated in FIG. 9, a bonding workpiece 900 is temporarily affixed to a first chuck or microtool 950. Bonding workpiece 900 is a semiconductor wafer that includes a host device layer 910 between a substrate 905 and BEOL metallization levels 915. Substrate 905 may be homogenous with device layer 910, or not (e.g., a transferred substrate). In exemplary embodiments, bonding substrate 900 is contiguous across multiple IC chips with streets 902 demarking where bonding workpiece 900 will be subsequently scribed during a singulation process. Alternatively, bonding workpiece 900 may be a reconstituted assembly of IC chips that have been previously singulated.

In some embodiments, top level of metallization levels 915 includes hybrid bonding feature 401, substantially as described above. In alternative embodiments, top level of metallization levels 915 includes hybrid bonding feature 601, substantially as described above. In still other embodiments, top level of metallization levels 915 includes hybrid bonding feature 801, substantially as described above.

Another bonding workpiece 1000 is similarly temporarily affixed to a second chuck or microtool 950. In the illustrated example, bonding workpiece 1000 is a semiconductor wafer that includes a host device layer 1010 between a substrate 1005 and BEOL metallization levels 1015. Substrate 1005 may be homogenous with device layer 1010, or not (e.g., a transferred substrate). In exemplary embodiments, bonding workpiece 1000 is contiguous across multiple IC chips with streets 1002 demarking where bonding workpiece 1000 will be subsequently scribed during a singulation process. Alternatively, bonding workpiece 1000 may be a reconstituted assembly of IC chips that have been previously singulated.

A top level of metallization levels 1015 includes hybrid bonding feature 201, having one or more of the attributes substantially as described above. In alternative embodiments, top level of metallization levels 1015 includes hybrid bonding feature 401, 601, or 801, for example substantially as described above. In a bonding process, hybrid bonding features 401 (or 601, or 801, etc.) are brought into alignment with, and into contact with, hybrid bonding features 201 (or 401, 601, 801, etc.) to form a composite interconnect structure. In this "face-to-face" configuration, a direct bond is formed between the hybrid bonding features of bonding workpieces 900 and 1000. An electrically conductive metal-metal bond at the interface of the hybrid bonding features 401, 201 may therefore provide a composite interconnect structure that functions as a good electrical interconnect between ICs.

Following bonding, methods 101 (FIG. 1) complete at block 145 where any conventional assembly techniques may be applied to the composite IC workpiece. The architecture of hybrid bonded structures in the composite workpiece may vary depending on whether both or only one of hybrid bonding workpieces are processed according to methods 101. The architecture of hybrid bonded structures may further vary depending on whether both or only one of selective metal augmentation and selective dielectric recession is practiced on a given bonding workpiece. FIG. 10A-12B further illustrate some exemplary hybrid bonded structures and resulting composite interconnect structures, in accordance with some exemplary embodiments. In FIG. 10A-12B, reference numbers are retained for features or structures that are as previously described.

Figure 10A:
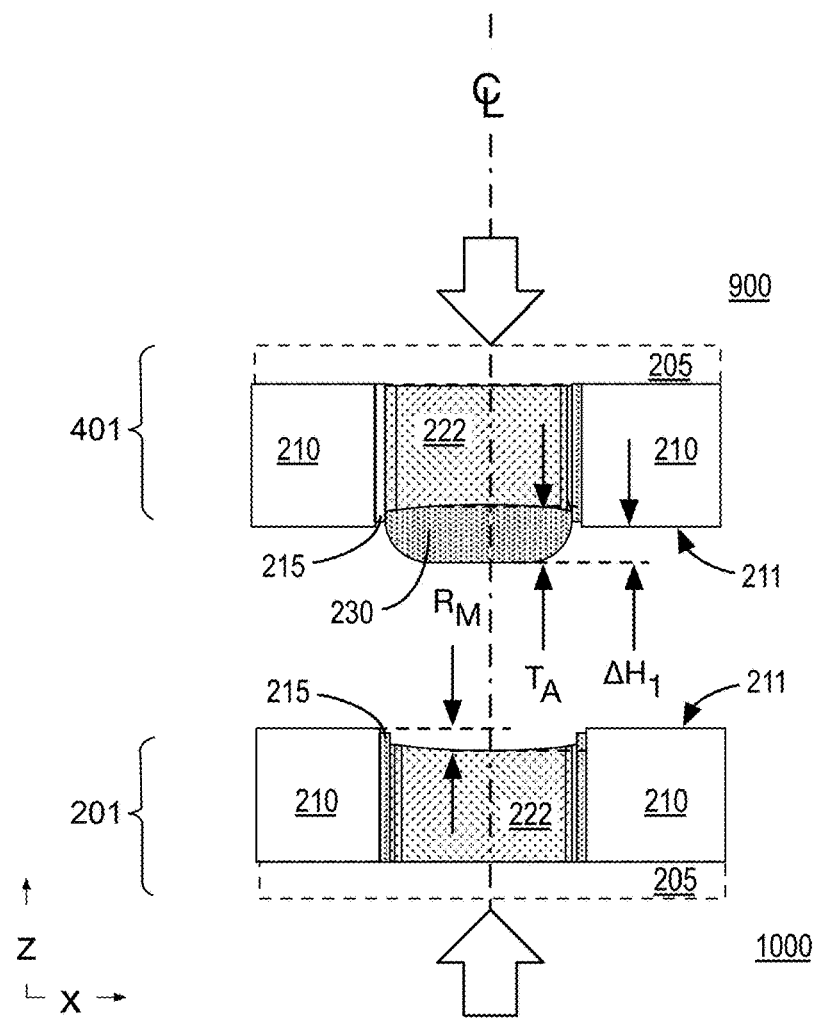
FIG. 10A is cross-sectional view of two hybrid bonding features as they are aligned for bonding, in accordance with some embodiments.
Figure 10B:
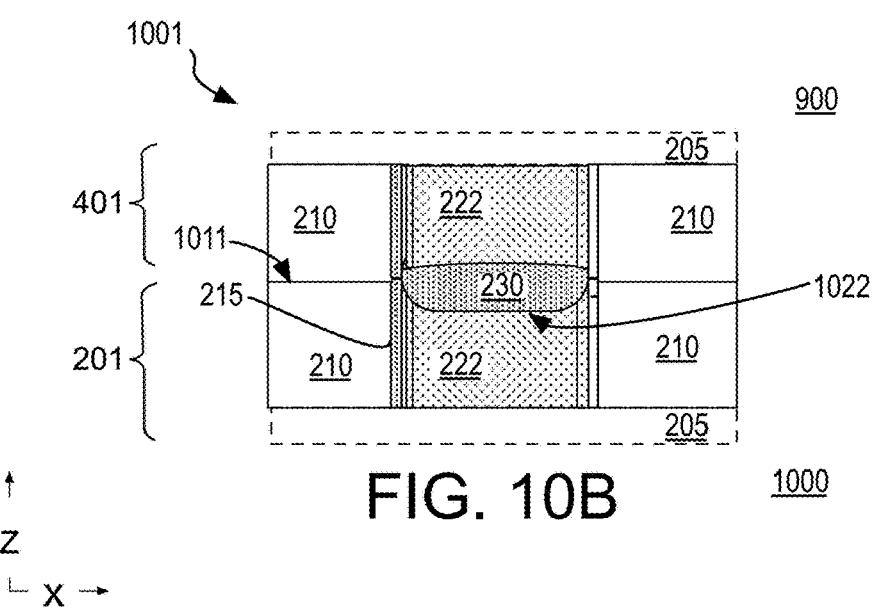
FIG. 10B is a cross-sectional view of a composite interconnect structure following hybrid bonding of the structures shown in FIG. 10A, in accordance with some embodiments.

FIG. 10A is cross-sectional view of two hybrid bonding features 201 and 401 as they are aligned for bonding, in accordance with some embodiments. FIG. 10A is therefore a magnified view of the bonding process illustrated in FIG. 9. As shown in FIG. 10A, features 201 and 401 are aligned along a common centerline. Once so aligned, hybrid bond features 201 and 401 are displaced relative to one another along the centerline, and a compression force applied along the centerline. In this example, augmentation metal 230 of feature 401 is aligned over a dished fill metal surface of feature 201. FIG. 10B is a cross-sectional view of a composite interconnect structure 1001 following hybrid bonding of features 201 and 401, in accordance with some embodiments. Although not drawn to scale, some lateral misalignment of features 201 and 401 is depicted in composite structure 1001.

As shown in FIG. 10B, augmentation metal 230 is embedded between two regions of fill metal 222. Depending on how workpieces 900 and 1000 have been fabricated, the two regions of fill metal 222 may have substantially the same composition, or not. Augmentation metal 230 is in z-axis alignment with a dielectric bond interface 1011 and is in direct contact with fill metals 222, forming a bond interface 1022 with the fill metal 222 of hybrid bond feature 201. In some embodiments, all instances of fill metal 222 are predominantly Cu, but one or more analysis techniques (e.g., XPS, XRD, or TEM) may be employed to identify augmentation metal 230 embedded between two regions of fill metal 222. Notably, augmentation metal 230 would be absent from any non-bonded (damascene) metallization layers. For example, augmentation metal 230 would be absent from BEOL metallization layers in each of bonding workpieces 900 and 1000 with augmentation metal 230 only being present at the hybrid bond interface.

Figure 11A:
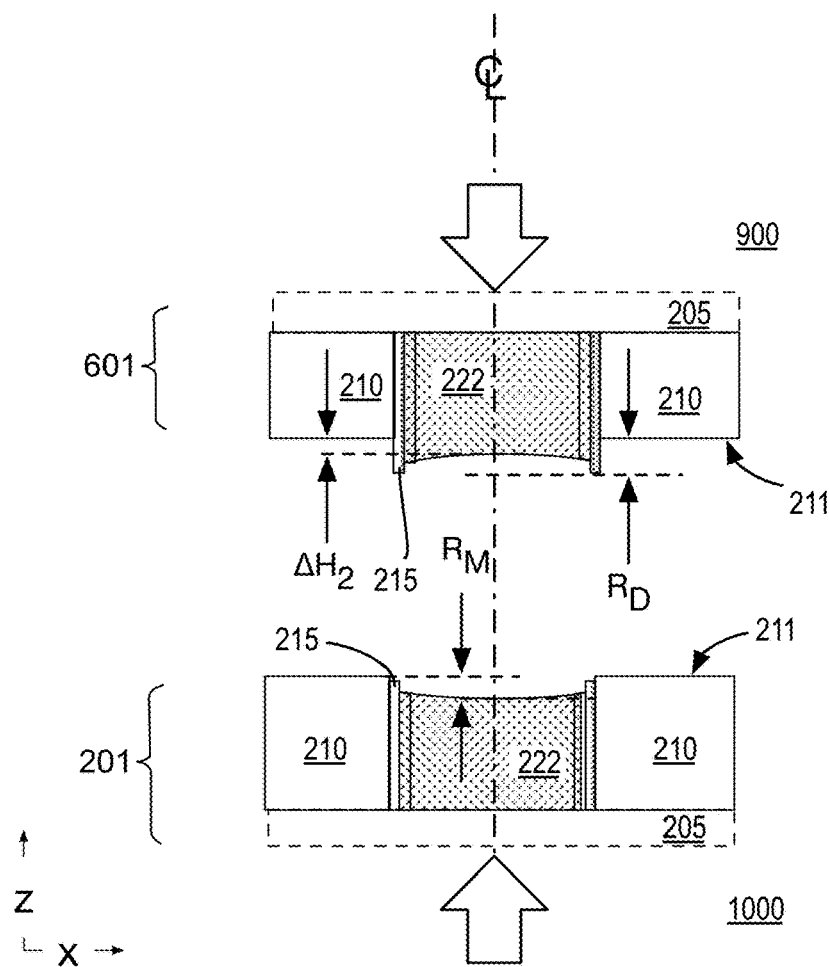
FIG. 11A is cross-sectional view of two hybrid bonding features as they are aligned for bonding, in accordance with some embodiments.
Figure 11B:
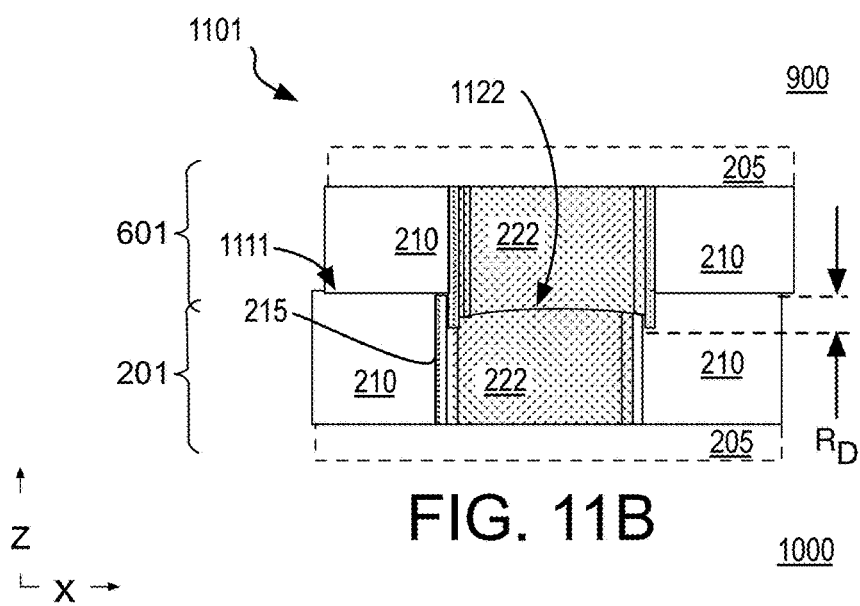
FIG. 11B is a cross-sectional view of a composite interconnect structure following hybrid bonding of the features shown in FIG. 11A, in accordance with some embodiments.

FIG. 11A is cross-sectional view of two hybrid bonding features 201 and 601 as they are aligned for bonding, in accordance with some other embodiments. FIG. 11A is therefore another magnified view of the bonding process illustrated in FIG. 9. As shown in FIG. 11A, features 201 and 601 are aligned along a common centerline. Once so aligned, hybrid bonding features 201 and 601 are displaced relative to one another along the centerline, and a compression force applied along the centerline. In this example, a recessed dielectric surface of feature 601 is aligned over non-recessed dielectric surface of feature 201. FIG. 11B is a cross-sectional view of a composite interconnect structure 1101 following hybrid bonding of features 201 and 601, in accordance with some embodiments. Although not drawn to scale, some lateral misalignment of features 201 and 601 is depicted in composite interconnect structure 1101.

As shown in FIG. 11B, fill metals 222 have a bond interface 1122, which is offset in the z-axis from dielectric bond interface 1111 by dielectric recess depth $R_D$. In this embodiment, no augmentation metal is present at bond interface 1122, but TEM may be employed to identify composite interconnect structure 1101 as resulting from a bond between hybrid bonding feature 201 and another having a recessed dielectric (hybrid bonding feature 601).

Figure 12A:
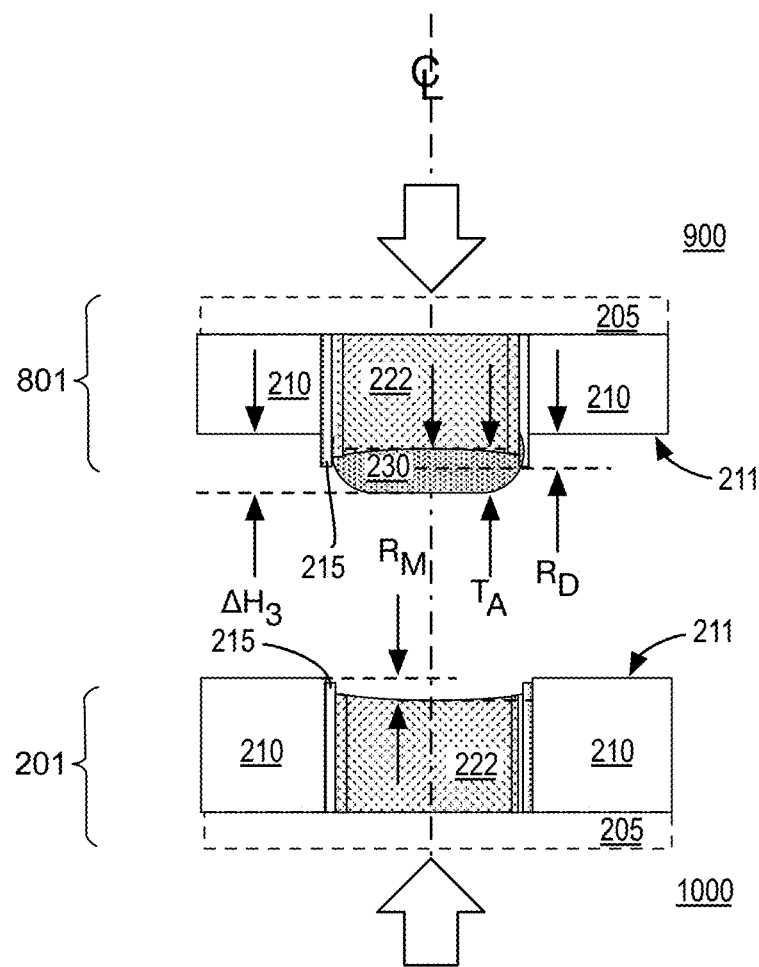
FIG. 12A is cross-sectional view of two hybrid bonding features as they are aligned for bonding, in accordance with some embodiments.
Figure 12B:
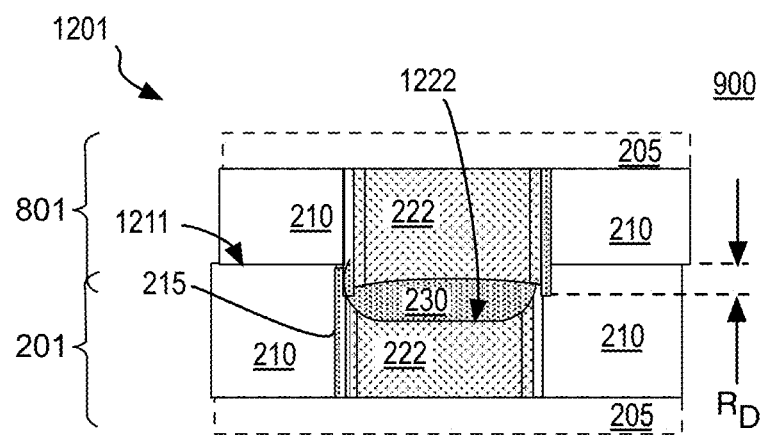
FIG. 12B is a cross-sectional view of a composite interconnect structure following hybrid bonding of the features shown in FIG. 12A, in accordance with some embodiments.

FIG. 12A is cross-sectional view of two hybrid bonding features 201 and 801 as they are aligned for bonding, in accordance with some other embodiments. FIG. 12A is therefore another magnified view of the bonding process illustrated in FIG. 9. As shown in FIG. 12A, hybrid bonding features 201 and 801 are aligned along a common centerline. Once so aligned, hybrid bonding features 201 and 801 are displaced relative to one another along the centerline, and a compression force applied along the centerline. In this example, augmentation metal 230 and a recessed dielectric surface of feature 801 is aligned over a dished metal feature and a non-recessed dielectric surface of feature 201. FIG. 12B is a cross-sectional view of a composite interconnect structure 1201 following hybrid bonding of hybrid bonding features 201 and 801, in accordance with some embodiments. Although not drawn to scale, some lateral misalignment of features 201 and 801 is depicted in composite interconnect structure 1201.

As shown in FIG. 12B, augmentation metal 230 is embedded between two regions of fill metal 222. In this example, augmentation metal 230 is again in direct contact with fill metals 222, forming a bond interface 1222 with the fill metal 222 of hybrid bond feature 201. In this embodiment however, augmentation metal 230 is offset along the z-axis from dielectric bond interface 1211 by dielectric recess depth $R_D$. One or more analysis techniques (e.g., XPS, XRD, or TEM) may be employed to identify augmentation metal 230 and characterize its location relative to dielectric bond interface 1211 (which may be evident through specific examination of barrier material 215 and hybrid bonding feature misalignment).

Figure 13A:
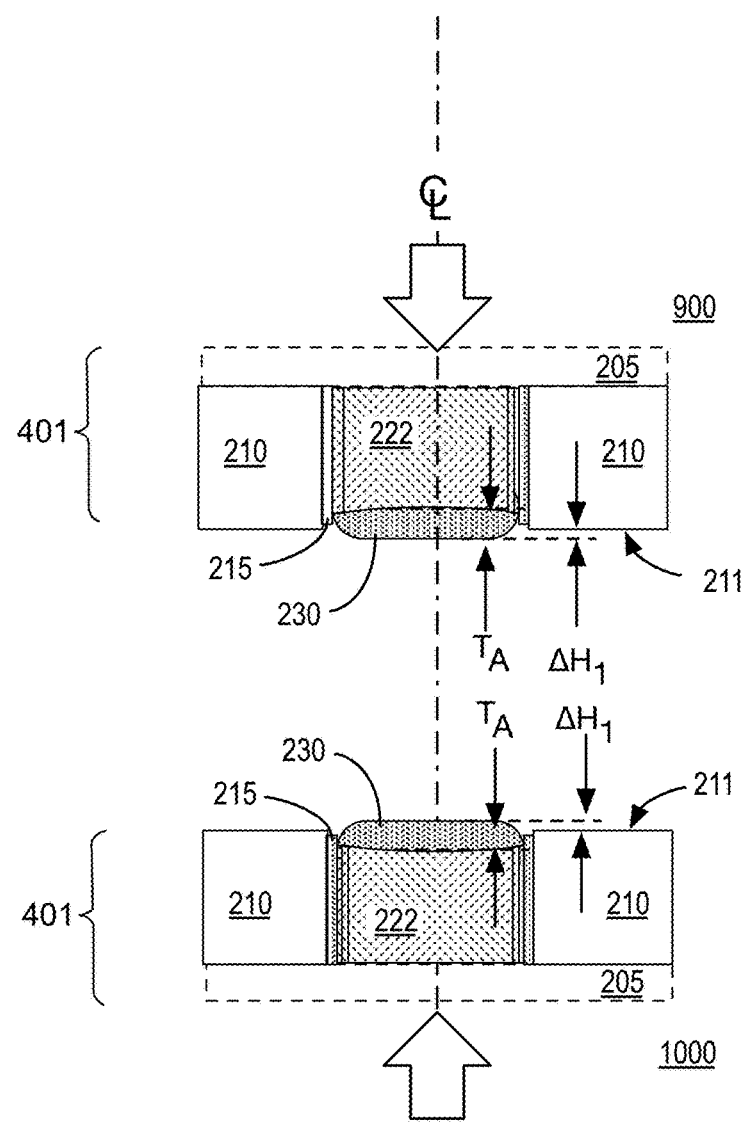
FIG. 13A is cross-sectional view of two hybrid bonding features as they are aligned for bonding, in accordance with some embodiments.
Figure 13B:
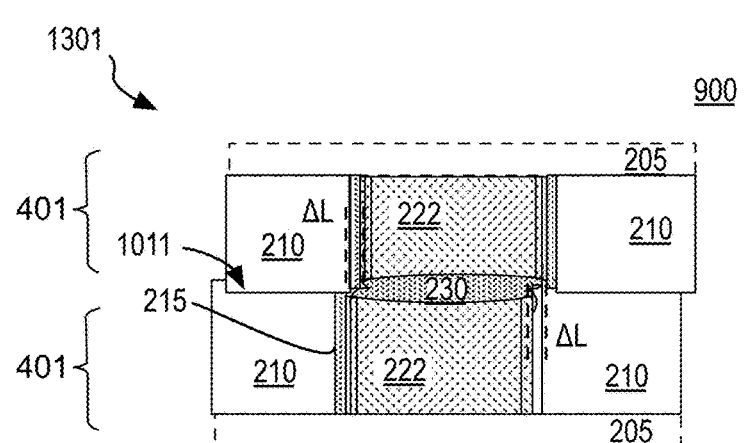
FIG. 13B is a cross-sectional view of a composite interconnect structure following hybrid bonding of the features shown in FIG. 13A, in accordance with some embodiments.

FIG. 13A is cross-sectional view of two hybrid bonding features 401 as they are aligned for bonding, in accordance with some embodiments. FIG. 13A is therefore another magnified view of the bonding process illustrated in FIG. 9 for embodiments where both bonding substrate 900 and 1000 are processed according to an embodiment of methods 101. FIG. 13B is a cross-sectional view of a composite interconnect structure 1301 following hybrid bonding of features 401, in accordance with some embodiments. Although not drawn to scale, some lateral misalignment of features 401 is depicted in composite interconnect structure 1301. As shown in FIG. 12B, augmentation metal 230 is embedded between two regions of fill metal 222 with end portions of augmentation metal 230 that have a lesser thickness being laterally offset by an amount ΔL associated with misalignment during a bonding processes. Hence, as compared to composite feature 1001 (FIG. 10B), a partial thickness of augmentation metal 230 at the misaligned edges is indicative of a portion of augmentation metal 230 having originated from each of bonding workpieces 900 and 100.

Figure 14:
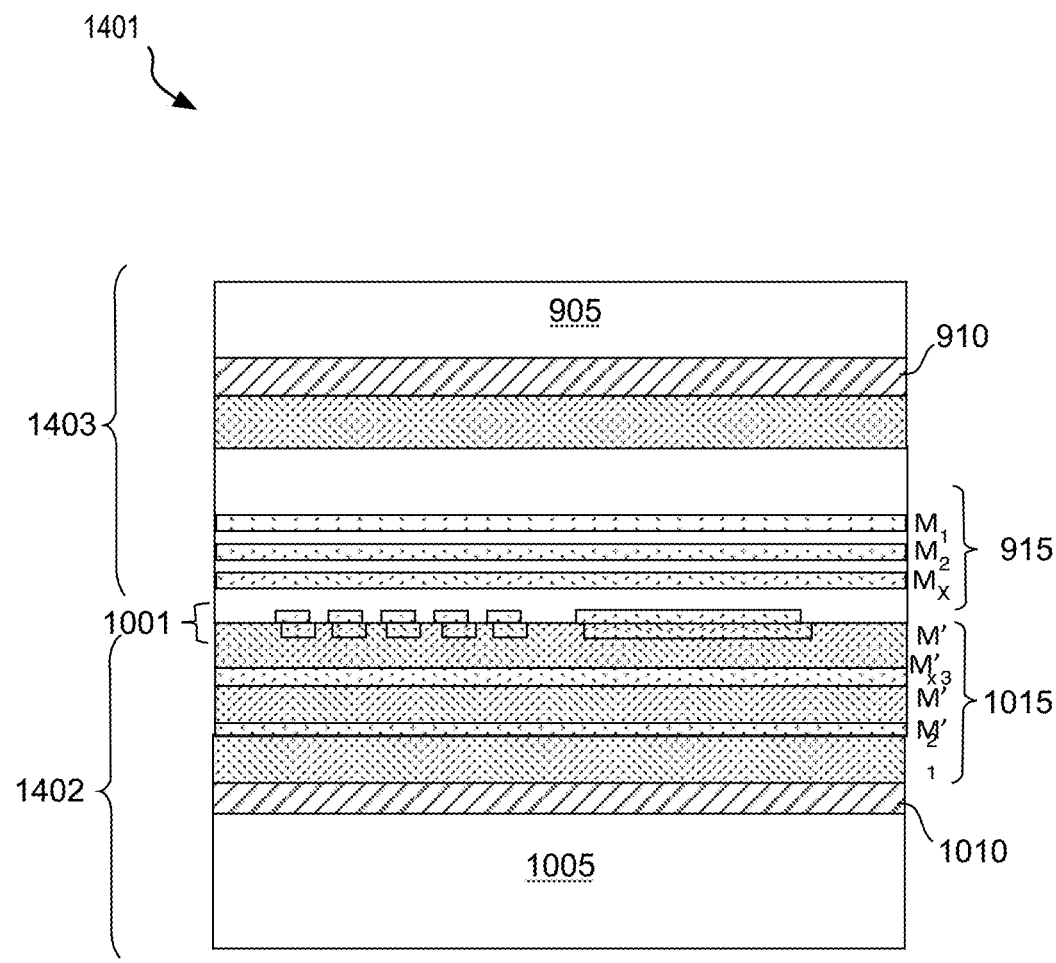
FIG. 14 is a cross-sectional view of a bonded IC structure comprising a composite interconnect structure including a diffusion barrier, in accordance with some embodiments.

Composite interconnect structures, such as any of those illustrated in FIG. 10A-13B, may be integrated into any composite IC device. Composite interconnect structures, such as those illustrated in FIG. 10A-13B, may be integrated into any composite IC device. FIG. 14 is a cross-sectional view of a bonded IC structure 1401 comprising composite interconnect structure 1001 that includes a supplemental diffusion barrier, which may have any of the features described above. In alternative embodiments, bonded IC structure 1401 may comprise composite interconnect structure 1101, or 1201, or 1301, for example having any of the corresponding features described above.

As shown in FIG. 14, a composite IC device 1401 includes a first IC chip 1402 electrically coupled to a second IC chip 1403 through composite interconnect structure 1001. In some examples, composite IC device 1401 has been singulated from a composite workpiece that included bonding workpieces 900 and 1000 (FIG. 9). IC device 1401 includes two device layers 910 and 1010 between two substrates 905 and 1005. BEOL metallization levels 915 interconnect transistors of device layer 910, and BEOL metallization levels 1015 interconnect transistors of device layer 1010. In passive interposer embodiments, at least one of device layers 910 or 1010 is absent with at least one of the bonding workpieces comprising only metallization levels 915 or 1015, respectively. Composite interconnect structure 1001 includes a predominantly Cu feature from an uppermost one of metallization levels 915 bonded to another predominantly Cu feature from an uppermost one of metallization levels 1015. At least where the two Cu features are laterally offset from each other, composite interconnect structure 1001 includes an augmentation metal between the Cu features and adjacent dielectric material, for example substantially as described elsewhere herein. As illustrated, composite IC device 1401 may be subsequently processed as any single IC chip might be. For example, a first-level interconnect (FLI) process may be performed and the composite IC device 1401 mounted to a host, such as a package substrate.

Figure 15:
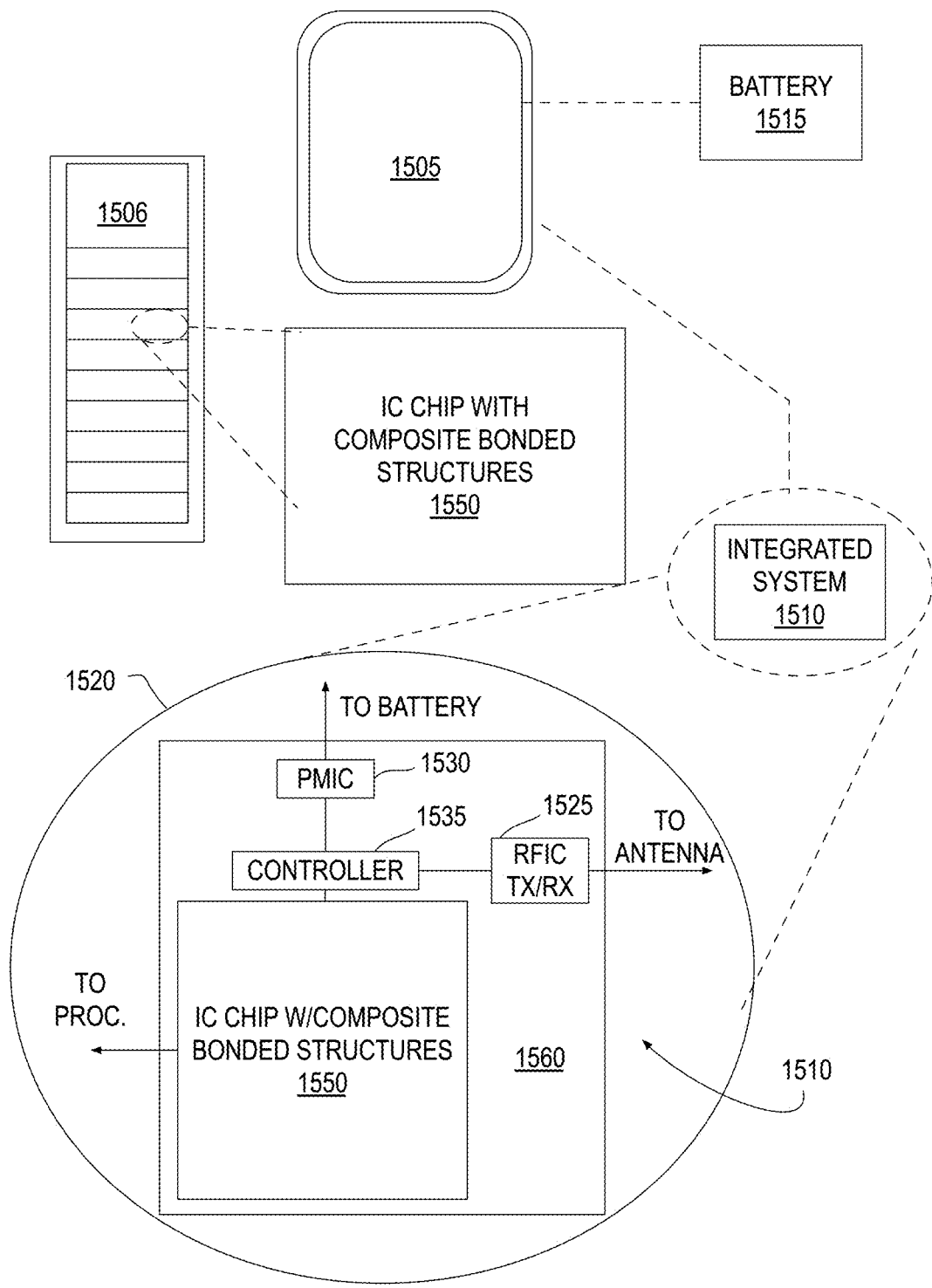
FIG. 15 illustrates a system employing a composite IC structure including a hybrid-bonded interface, in accordance with some embodiments.

FIG. 15 illustrates a system in which a mobile computing platform 1505 and/or a data server machine 1506 employs an IC including at least one hybrid bonded composite structure, in accordance with some embodiments. The server machine 1506 may be any commercial server, for example including any number of high-performance computing platforms disposed within a rack and networked together for electronic data processing, which in the exemplary embodiment includes a packaged composite IC 1550. The mobile computing platform 1505 may be any portable device configured for each of electronic data display, electronic data processing, wireless electronic data transmission, or the like. For example, the mobile computing platform 1505 may be any of a tablet, a smart phone, laptop computer, etc., and may include a display screen (e.g., a capacitive, inductive, resistive, or optical touchscreen), a chip-level or package-level integrated system 1510, and a battery 1515.

Whether disposed within the integrated system 1510 illustrated in the expanded view 1520, or as a stand-alone packaged chip within the server machine 1506, composite IC 1550 may include at least one composite interconnect structure having an augmentation metal or a recessed dielectric, for example as described elsewhere herein. Composite IC 1550 may further include silicon CMOS. Composite IC 1550 may be further coupled to a host substrate 1560, along with, one or more of a power management integrated circuit (PMIC) 1530, RF (wireless) integrated circuit (RFIC) 1525 including a wideband RF (wireless) transmitter and/or receiver (TX/RX) (e.g., including a digital baseband and an analog front end module further comprises a power amplifier on a transmit path and a low noise amplifier on a receive path), and a controller 1535. PMIC 1530 may perform battery power regulation, DC-to-DC conversion, etc., and so has an input coupled to battery 1515 and with an output providing a current supply to other functional modules. Composite IC 1550 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 16:
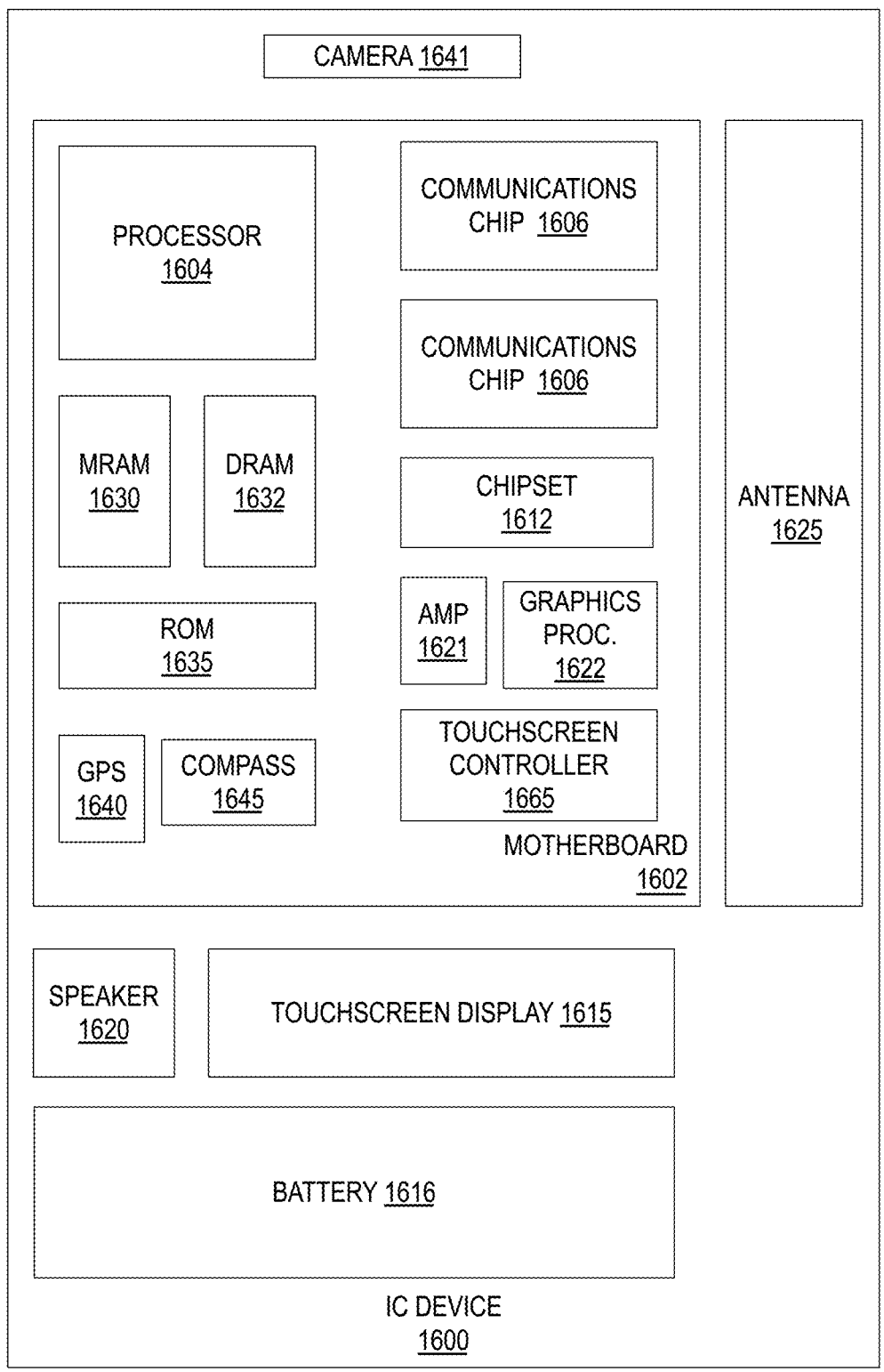
FIG. 16 is a functional block diagram illustrating an electronic computing device, in accordance with some embodiments.

FIG. 16 is a functional block diagram of an electronic computing device 1600, in accordance with some embodiments. Device 1600 further includes a motherboard 1602 hosting a number of components, such as, but not limited to, a processor 1604 (e.g., an applications processor). Processor 1604 may be physically and/or electrically coupled to motherboard 1602. In some examples, processor 1604 includes a composite IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1606 may also be physically and/or electrically coupled to the motherboard 1602. In further implementations, communication chips 1606 may be part of processor 1604. Depending on its applications, computing device 1600 may include other components that may or may not be physically and electrically coupled to motherboard 1602. These other components include, but are not limited to, volatile memory (e.g., DRAM 1632), non-volatile memory (e.g., ROM 1635), flash memory (e.g., NAND or NOR), magnetic memory (MRAM 1630), a graphics processor 1622, a digital signal processor, a crypto processor, a chipset 1612, an antenna 1625, touchscreen display 1615, touchscreen controller 1665, battery 1616, audio codec, video codec, power amplifier 1621, global positioning system (GPS) device 1640, compass 1645, accelerometer, gyroscope, speaker 1620, camera 1641, and mass storage device (such as hard disk drive, solid-state drive (SSD), compact disk (CD), digital versatile disk (DVD), and so forth), or the like. In some exemplary embodiments, at least one of the functional blocks noted above comprise an IC device including a composite hybrid bonded interface, for example as described elsewhere herein.

Communication chips 1606 may enable wireless communications for the transfer of data to and from the computing device 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1606 may implement any of a number of wireless standards or protocols, including but not limited to those described elsewhere herein. As discussed, computing device 1600 may include a plurality of communication chips 1606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, an integrated circuit (IC) device structure comprises first metallization layers interconnected to transistors of a first device layer, second metallization layers interconnected to transistors of a second device layer, and a composite interconnect structure comprising a first feature of one of the first metallization layers, a second feature of one of the second metallization layers, and an augmentation metal at a bond interface between the first and second feature. The augmentation metal comprises copper.

In second examples, for any of the first examples the first feature and the second feature each comprise copper.

In third examples, for any of the first or second examples the augmentation metal has at least one of a different density, different crystallinity, or different impurity content than at least one of the first or second features.

In fourth examples, for any of the third examples the augmentation metal has at least one of a higher density, or lower impurity content than at least one of the first or second features.

In fifth examples, for any of the first through fourth examples the first and second features have a lateral length of at least 1 µm, and the augmentation metal has a thickness less than 100 nm.

In sixth examples, for any of the first through fifth examples the composite interconnect structure further comprises a first barrier material between a sidewall of the first feature and a sidewall of a first dielectric material, and a second barrier material between a sidewall of the second feature and a sidewall of a second dielectric material. A bond interface between the first and second dielectric materials is offset from the augmentation metal toward one of the first or second device layers.

In seventh examples, for any of the sixth examples at least one of the first and second barrier materials comprise at least one of Ta, W, Ti, or N.

In eighth examples, an integrated circuit (IC) device structure comprises first metallization layers interconnected to transistors of a first device layer, second metallization layers interconnected to transistors of a second device layer, and a composite interconnect structure at a bond interface of one of the first metallization layers and one of the second metallization layers. The composite interconnect structure comprises a first feature of one of the first metallization layers, a first barrier material between a sidewall of the first feature and a sidewall of a first dielectric material, a second feature of one of the second metallization layers, the second feature joined to the first feature at a first bond interface. The composite interconnect structure comprises a second barrier material between a sidewall of the second feature and a sidewall of a second dielectric material, wherein a second bond interface between the first and second dielectric materials is offset from the first bond interface toward one of the first or second device layers.

In ninth examples, for any of the eighth examples at least one of the first feature and the second feature comprise copper, at least one of the first and second barrier materials comprise at least one of Ta, W, or Ti, the first and second features each have a lateral length of at least 1 µm, and the first and second bond interfaces are offset by less than 100 nm.

In tenth examples, for any of the eighth or ninth examples the composite interconnect structure further comprises an augmentation metal at the first bond interface, the augmentation metal having at least one of a different density, different crystallinity, or different impurity content than at least one of the first or second features.

In eleventh examples, for any of the eighth through tenth examples, the augmentation metal, the first feature, and the second feature all comprise copper, and wherein the augmentation metal has at least one of a higher density or lower impurity content than at least one of the first or second features.

In twelfth examples, a method of fabricating an integrated circuit (IC) structure comprises forming a first hybrid bonding interface comprising a first metallization feature and a first dielectric material. The method comprises forming a second hybrid bonding interface comprising a second metallization feature and a second dielectric material. The method comprises selectively augmenting at least one of the first or second metallization features with an autocatalytic metal deposition process. The method comprises bonding the first hybrid bonding interface to the second hybrid bonding interface.

In thirteenth examples, for any of the twelfth examples forming the first hybrid bonding interface comprises a first chemical mechanical planarization process that recesses a surface of the first metallization feature below a surface of the first dielectric material. Forming second hybrid bonding interface comprises a second chemical mechanical planarization process that recesses a surface of the second metallization feature below a surface of the second dielectric material. Selectively augmenting at least one of the first or second metallization features comprises depositing a metal selectively onto at least one of the recessed surfaces of the first or second metallization features.

In fourteenth examples, for any of the twelfth or thirteenth examples the first metallization feature comprises Cu, and depositing the metal selectively further comprises depositing a metal comprising Cu upon the first metallization feature.

In fifteenth examples, for any of the twelfth through fourteenth examples the first and second metallization features each have a lateral dimension of at least 1 µm, the first and second metallization feature surfaces are recessed below the dielectric surfaces by at less than 50 nm, and selectively augmenting at least one of the first or second metallization features comprises depositing a metal to a thickness of less than 100 nm.

In sixteenth examples, for any of the twelfth through fifteenth examples, the method further comprises selectively recessing a surface of at least one of the first or second dielectric materials relative to a surface of the first or second metallization features with a dielectric etch process prior to the bonding.

In seventeenth examples, a method of fabricating an integrated circuit (IC) structure comprises forming a first hybrid bonding interface comprising a first metallization feature and a first dielectric material. The method comprises forming a second hybrid bonding interface comprising a second metallization feature and a second dielectric material. The method comprises selectively recessing a surface of at least one of the first or second dielectric materials relative to a surface of the first or second metallization features with a dielectric etch process. The method comprises bonding the first hybrid bonding interface to the second hybrid bonding interface.

In eighteenth examples, for any of the seventeenth examples the first and second metallization features each have a lateral dimension of at least 1 µm. Forming the first hybrid bonding interface comprises a first chemical mechanical planarization (CMP) process that recesses a surface of the first metallization feature below a surface of the first dielectric material. Forming second hybrid bonding interface comprises a second CMP process that recesses a surface of the second metallization feature below a surface of the second dielectric material. Selectively recessing the surface of at least one of the first or second dielectric materials further comprises removing less than 100 nm from the first dielectric material.

In nineteenth examples, for any of the eighteenth examples the first metallization feature comprises Cu, and selectively recessing the surface of at least one of the first or second dielectric materials further comprises etching the first dielectric material with a fluorine-based plasma.

In twentieth examples, for any of the seventeenth through eighteenth examples the method further comprises selectively augmenting at least one of the first or second metallization features comprises depositing a metal selectively onto at least one.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) device structure, comprising:
    first metallization layers coupled with transistors of a first device layer;
    second metallization layers coupled with transistors of a second device layer; and
    a composite interconnect structure comprising:
       a first metallization feature of one of the first metallization layers;

a second metallization feature of one of the second metallization layers; and a metal between the first metallization feature and a bond interface with the second metallization feature.

2. The IC device structure of claim 1, wherein the first metallization feature is adjacent to a first dielectric material;

the second metallization feature is adjacent to a second dielectric material;

a plane of a bond interface between the first and second dielectric materials is offset from a plane of the bond interface with the second metallization feature toward the second device layer; and a thickness of the metal is within the offset between the first and second bond interfaces.

3. The IC device structure of claim 2, wherein the bond interface between the first and second dielectric materials intersects a sidewall of the metal.

4. The IC device structure of claim 2, wherein the composite interconnect structure further comprises a first barrier material adjacent to a sidewall of the first dielectric material, and a second barrier material adjacent to a sidewall of the second dielectric material.

5. The IC device structure of claim 4, wherein the metal is laterally confined to within the sidewalls of the first and second dielectric materials.

6. The IC device structure of claim 1, wherein the metal comprises Cu.

7. The IC device structure of claim 6, wherein the first metallization feature and the second metallization feature each comprise copper.

8. The IC device structure of claim 1, wherein the metal has at least one of a different density, different crystallinity, or different impurity content than at least one of the first metallization feature or second metallization feature.

9. The IC device structure of claim 1, wherein the metal has a thickness of at least 5 nm.

10. An integrated circuit (IC) device structure, comprising:

first metallization layers coupled with transistors of a first device layer;

second metallization layers coupled with transistors of a second device layer; and a composite interconnect structure comprising:

a first metallization feature of one of the first metallization layers, wherein the first metallization feature is adjacent to a first dielectric material; and a second metallization feature of one of the second metallization layers, wherein:

the second metallization feature is adjacent to a second dielectric material; and the second metallization feature is joined to the first metallization feature at a first bond interface that is offset from a second bond interface between the dielectric materials toward one of the first or second device layers.

11. The IC device structure of claim 10, wherein the first and second bond interfaces are offset by at least 5 nm.

12. The IC device structure of claim 10, wherein at least one of the first metallization feature or the second metallization feature comprises copper.

13. The IC device structure of claim 10, wherein at least one of the first metallization feature or the second metallization feature comprises a barrier layer between the copper and the adjacent dielectric materials, the barrier layer comprising at least one of Ta, Ti, or W.

14. The IC device structure of claim 10, further comprising a metal between the first metallization feature and the bond interface with the second metallization feature, the metal having a thickness at least partially accounting for the offset between the first and second bond interfaces.

15. The IC device structure of claim 14, wherein the metal has at least one of a different density, different crystallinity, or different impurity content than at least one of the first metallization feature or second metallization feature.

16. A method of fabricating an integrated circuit (IC) structure, the method comprising:

receiving a first workpiece with a first hybrid bonding interface comprising a first metallization feature adjacent to a first dielectric material;

receiving a second workpiece with a second hybrid bonding interface comprising a second metallization feature and a second dielectric material, wherein a top surface of the second metallization feature is proud of a surface of the adjacent dielectric material; and joining the first workpiece to the second workpiece by bonding the first hybrid bonding interface to the second hybrid bonding interface.

17. The method of claim 16, further comprising augmenting the second metallization feature with a selective deposition process until the top surface of the second metallization feature is proud of the surface of the adjacent dielectric material by no more than 100 nm.

18. The method of claim 17, wherein the second metallization feature comprises copper and the selective deposition process comprises an autocatalytic Cu deposition process.

19. The method of claim 16, further comprising selectively recessing a surface of the first or second dielectric material relative to a top surface of the second metallization feature with a dielectric etch process until the top surface of the second metallization feature is proud of the surface of the adjacent dielectric material by no more than 100 nm.

20. The method of claim 17, further comprising:

forming the first hybrid bonding interface with a first chemical mechanical planarization (CMP) process that recesses a surface of the first metallization feature below a surface of the first dielectric material; and forming the second hybrid bonding interface with a second CMP process that recesses a surface of the second metallization feature below a surface of the second dielectric material.

* * * * *